United States Patent [19]

Palara et al.

[11] Patent Number: 5,140,591
[45] Date of Patent: Aug. 18, 1992

[54] GENERATOR OF DRIVE SIGNALS FOR TRANSISTORS CONNECTED IN A HALF-BRIDGE CONFIGURATION

[75] Inventors: Sergio Palara, Acicastello; Paolo Monaco, Lentini, both of Italy

[73] Assignee: SGS-Thomson Microelectronics s.r.l., Milan, Italy

[21] Appl. No.: 446,866

[22] Filed: Dec. 6, 1989

[30] Foreign Application Priority Data

Dec. 15, 1988 [IT] Italy .................. 22952 A/88

[51] Int. Cl.[5] .................. H03K 3/01; H03K 4/08; H03K 5/00; G06G 7/12
[52] U.S. Cl. .................. 307/270; 307/228; 307/261; 307/494; 307/360; 307/555
[58] Field of Search .............. 307/270, 254, 571, 242, 307/228, 494, 360, 362, 261, 262, 555

[56] References Cited

U.S. PATENT DOCUMENTS

| | | | |
|---|---|---|---|
| 4,454,454 | 6/1984 | Valentine | 307/270 |
| 4,503,396 | 3/1985 | Fawkes | 307/228 |
| 4,820,940 | 4/1989 | Wachi et al. | 307/228 |
| 4,910,416 | 3/1990 | Salcone | 307/254 |
| 4,990,833 | 2/1991 | Morrish | 307/228 |
| 5,045,800 | 9/1991 | Kung | 307/261 |

Primary Examiner—Stanley D. Miller
Assistant Examiner—Trong Phan
Attorney, Agent, or Firm—Sixbey, Friedman, Leedom & Ferguson

[57] ABSTRACT

The generator of drive signals comprises a ramp generator suitable for receiving a square waveform input signal and for converting it into an output signal variable between a lower level and an upper level with upward and downward ramps having a preset slope, a first comparator with a non-inverting input connected to the output of said ramp generator and an inverting input connected to a first reference signal source and a second comparator with an inverting input connected to the output of said ramp generator and a non-inverting input connected to a second reference signal source.

5 Claims, 3 Drawing Sheets

GENERATOR OF DRIVE SIGNALS FOR TRANSISTORS CONNECTED IN A HALF-BRIDGE CONFIGURATION

The present invention relates to a generator of drive signals for transistors connected in a half-bridge configuration.

It is known that the drive of transistors in a half-bridge circuit requires that from an input signal normally constituted by a variable duty-cycle square waveform there are obtained two waveforms at the same frequency of the input signal, with which there are separately driven respective final stages of drives for the upper transistor and for the lower transistor of the half-bridge.

It is necessary that the two waveforms be generated so as to take into account a fundamental requirement for the operation of the half-bridge, that is, they must be such as not to determine the simultaneous conduction of the two transistors, which would lead to the breakage of the transistors themselves.

More accurately, the activation of the two final stages must be alternated and there must exist "dead times" during which both stages are disactivated to allow the transistor previously in conduction to reach complete shut-off before the other starts to conduct.

It is thus necessary that the two waveforms include activation periods of their respective final stages in alternation to one another and of duration lower than the corresponding disactivation periods of the other waveform.

One currently known solution for the conversion of the input signal into two waveforms having the above requirements is based on the use of a signal processor, which operates in response to the leading and trailing edges of the input signal so as to define output signals whose activation periods are suitably reduced with respect to the disactivation ones.

However, a processor is a complex and expensive device which is not compatible with many usage requirements of the half-bridge circuit.

The object of the present invention is thus to accomplish a drive generator for a half-bridge circuit, which is to be simple, inexpensive and at the same time fully reliable.

A further object of the present invention is also that to accomplish a drive signal generator which allows a wide flexibility of variation in activation and disactivation times according to the requirements of use.

Yet another object is lastly that to accomplish a drive signal generator which may be integrated in a monolithic version.

In view of these objects the drive signal generator according to the present invention is characterized in that it comprises a ramp generator suitable for receiving a square wave input signal and converting it into an output signal variable between a lower level and an upper level with upward and downward ramps having a preset slope, a first comparator with a non-inverting input connected to the output of said ramp generator and an inverting input connected to a first reference signal source to generate a first drive signal having activation periods whose duration is reduced with respect to those of disactivation and depending on the slope of said upward and downward ramps, and a second comparator with an inverting input connected to the output of said ramp generator and a non-inverting input connected to a second reference signal source to generate a second drive signal having activation periods alternated with those of said first drive signal and whose duration is reduced with respect to those of disactivation and depending on the slope of said upward and downward ramps.

One possible embodiment of the present invention is illustrated, as a non-limiting example, in the enclosed drawings, wherein.

Figure 1:
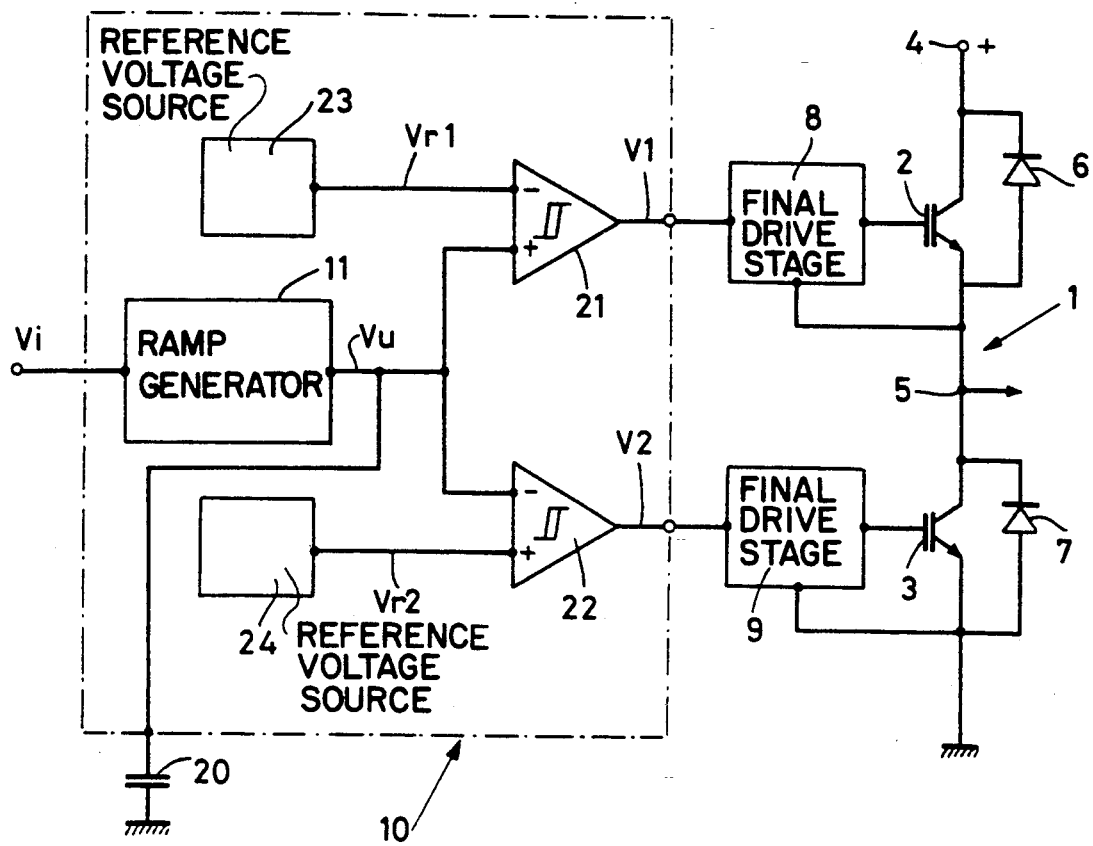
FIG. 1 shows a block diagram of a generator of drive signals for half-bridge circuits according to the invention.

FIG. 1 shows a half-bridge circuit 1 formed by two NMOS power transistors 2 and 3 connected in series between a positive power supply terminal 4 and ground. An intermediate branch point 5 is, as usual, connected to the load under control. Recycling diodes 6 and 7 are connected in antiparallel with respect to transistors 2 and 3.

Transistors 2 and 3 are controlled by respective final drive stages 8 and 9, which in turn are driven in alternation to one another by a drive signal generator 10 according to the present invention.

Figure 3:
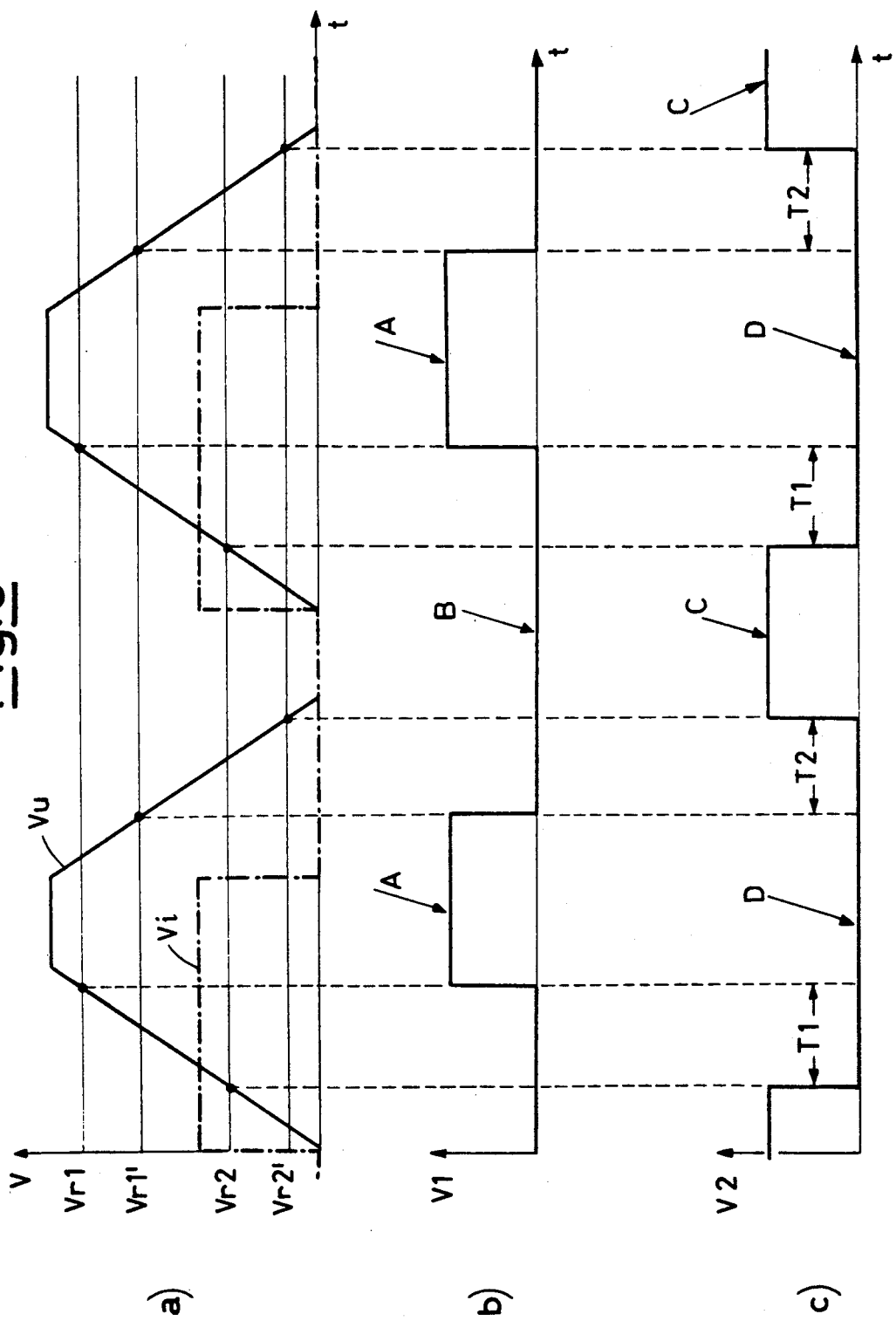
FIG. 3 shows the curve over time of the principal signals operating in the generator of FIG. 1.

Generator 10 comprises in the first place a ramp generator 11, which receives an input signal Vi having square waveform with a variable duty cycle and can convert it into an output signal Vu having variable amplitude between a lower level and an upper level with upward and downward ramps having a preset slope. The waveforms of signals Vi and Vu are shown in graph a) of FIG. 3.

Figure 2:
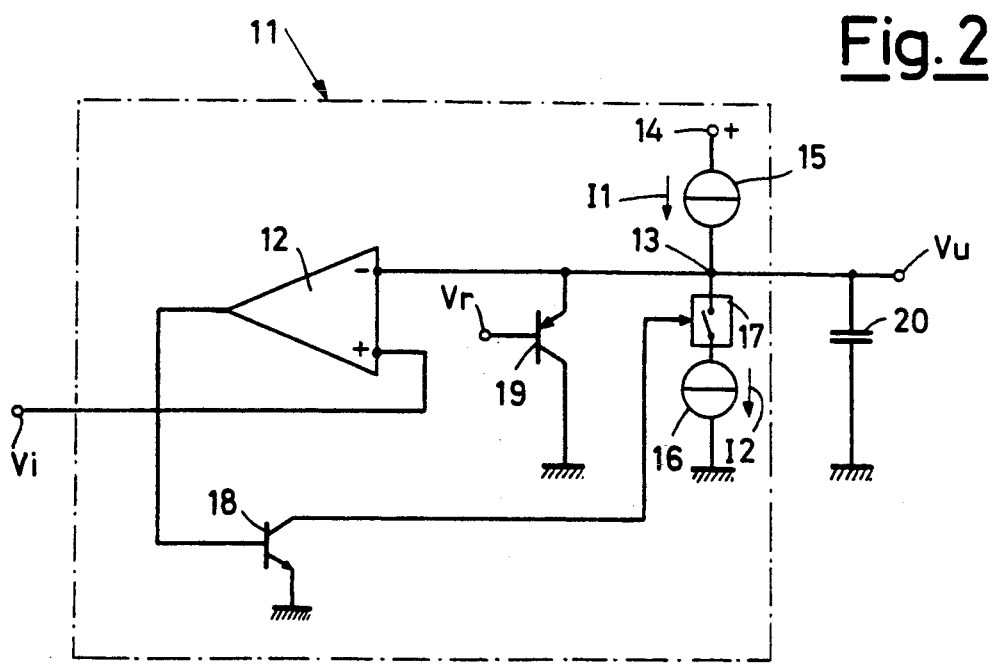
FIG. 2 shows a circuit diagram in greater detail of the ramp generator included in the generator of drive signals of FIG. 1.

A typical ramp generator 11 which may be used in the drive signal generator 10 of FIG. 1 is that illustrated in FIG. 2 and comprises a comparator 12 with a non-inverting input driven by the input signal Vi and invertising input connected to the circuit branch point 13, at which the output signal Vu is made available. The above circuit branch point 13 is connected to a positive power supply terminal 14 by means of a first current generator 15 and to ground by means of a second current generator 16, to which there is connected in series a switch 17 controlled by the collector of an NPN transistor 18, whose emitter is connected to ground and the base is connected to the output of comparator 12. The circuit branch point 13 is also connected to the emitter of a PNP transistor 19, whose collector is connected to ground and the base is supplied with a reference voltage Vr. The circuit branch point 13 is also connected to ground by means of an external capacitor 20.

The ramp generator of FIG. 2 operates as follows. The comparator 12 is so made as to keep transistor 18 on until the level of the input signal Vi is high. When it is on, transistor 18 keeps switch 17 open and thus the current generator 16 is inactive. Under these conditions the current I1 of generator 15 charges the external capacitor 20, raising the voltage Vu across its terminals. Rise occurs with a slope which is in relation to the value of current I1 and to the capacity of capacitor 20 and continues until voltage Vu is made to reach the maximum value which determines conduction of transistor 19 and the consequent discharge to ground of the current I1.

When the input signal Vi goes to a low level, comparator 12 interdicts on the other hand transistor 18, which closes switch 17 and thus activates current generator 16. Condenser 20 then discharges with current I2-I1, causing voltage Vu to fall with a slope depending on the difference between currents I2 and I1 and on the capacity of capacitor 20. Descent continues until it reaches the minimum value which determines the new cut-out of transistor 19.

There is thus obtained for Vu the waveform illustrated in FIG. 3a, wherein, as has been seen, the slopes depend on the currents in generators 15 and 16 and on the capacity of capacitor 20. Since the currents in the generators are fixed, with techniques known to the designer, in relation to the ratios between reference voltages and resistances, such currents may be varied by introducing an adjustment of the resistances, say by "zener-zapping", if necessary even during the tests on the silicon strip. In this way it is possible to set right from the above tests the dead times required, as shall be seen, between the turn-on of one power transistor and the turn-off of the previous one.

Returning to the overall diagram of FIG. 1, the output signal Vu of the ramp generator 11 is applied across the non-inverting input of a first hysteresis comparator 21 and across the inverting input of a second hysteresis comparator 22. Comparator 21 has the inverting input connected to a first source of reference voltage 23, which generates a reference voltage Vr1, and comparator 22 has the non-inverting input connected to a second source of reference voltage 24, which generates a reference voltage Vr2 which is lower than the previous one. The outputs of comparators 21 and 22 are connected to the inputs of the final stages 8 and 9, respectively.

When the upward ramp of the signal Vu, which began as already seen from the leading edge of signal Vi, reaches the reference threshold Vr1 set by source 23, comparator 21 changes state and its output signal V1, which up to that moment was at a low level, trips to a high level (FIG. 3b).

Comparator 21 returns to the original state, and consequently output signal V1 trips to a low level, when voltage Vu decreases until it reaches the value Vr1', lower than Vr1 by a difference representative of the hysteresis of comparator 21.

The signal V1 at the output of comparator 21, constituting the drive signal of the final stage 8, thus has the waveform illustrated in FIG. 3b, that is, it has a square waveform with activation periods A between the leading edge and the subsequent trailing edge whose duration is less than that of the alternated disactivation periods B.

The same signal Vu sent to the inverting input of comparator 22 determines, on the other hand, coincident with the reaching of threshold Vr2 during the upward stage and with the reaching of threshold Vr2' during the downward stage, the formation of a drive signal V2 with the waveform illustrated in FIG. 3c, that is, with activation periods C alternated with activation periods A of signal V1 and in their turn having a duration which is less than that of the corresponding disactivation periods D.

From a comparison of the waveforms of the drive signals V1 and V2 (FIGS. 3b and 3c) it appears that the activation periods A and C of the above signals are alternated by dead times T1 and T2 which allow transistors 2 and 3 of the half-bridge circuit to turn themselves off with safety before the other transistor begins conduction.

The duration of the dead time T1 is determined by the slope of the upward ramp of signal Vu and by the difference between the voltage thresholds Vr1 and Vr2.

The duration of the dead time T2 is in turn determined by the slope of the downward ramp of signal Vu and by the difference between the voltage thresholds Vr1' and Vr2'.

The two dead times T1 and T2 may therefore be varied by changing in the manner explained above the slope of the upward and downward ramps of signal Vu or by changing the reference voltages Vr1 and Vr2 or again by changing the hystereses (Vr1-Vr1', Vr2-Vr2') of comparators 21 and 22.

The upper and lower final stages 8 and 9 may be accomplished according to standard configurations of different types (push-pull, totem pole, etc.) and may drive bipolar, power MOS or HIMOS transistors.

Figure 4:
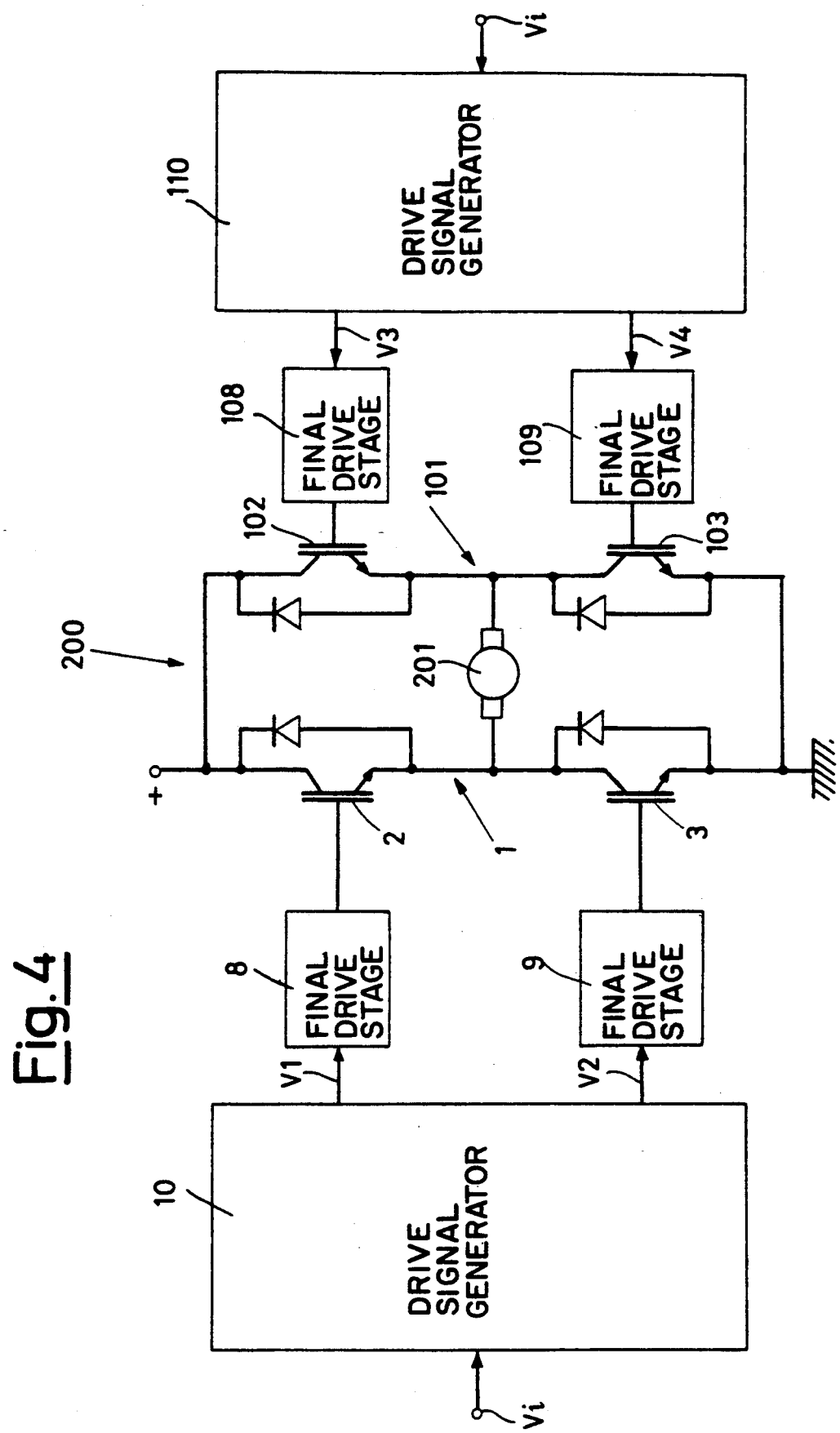
FIG. 4 shows an example of the application of two generators like that of FIG. 1 for driving the transistors of respective half-bridges of a bridge circuit used to control a direct current electric motor.

Naturally two pairs of drive signal generators according to the invention 10; 110 may be used for piloting by means of respective final stages 8, 9; 108, 109 respective half-bridges 1; 101 which constitute a bridge circuit 200 used for controlling a load, such as for example a direct current electric motor 201 (FIG. 4).

In such a case, assuming that the drive system is of the non-symmetrical type, that is that transistors 8, 108, equal to one another, are not of the same type as transistors 9, 109, in their turn equal to one another, it may be feared that, with an input signal Vi having a 50% duty cycle, the condition of motor stoppage does not occur. In order not to have problems it is, however, sufficient, to arrange for drive signals V1, V2; V3, V4 to determine dead times T1=T3 and T2=T4. The bridge circuit then operates correctly.

We claim:

1. A generator of drive signals for transistors connected in a half-bridge configuration, characterized in that it comprises a ramp generator suitable for receiving a square wave input signal and converting it into an output signal variable between a lower level and an upper level with upward and downward ramps having a preset slope, a first comparator with a non-inverting input connected to the output of said ramp generator and an inverting input connected to a first source for a first reference signal having a first constant value to generate a first square wave drive signal having activation periods whose duration is shorter than a duration of periods of disactivation of said first square wave drive signal and depending on the slopes of said upward and downward ramps, and a second comparator with an inverting input connected to the output of said ramp generator and a non-inverting input connected to a second source for a second reference signal having a second constant value to generate a second square wave drive signal having activation periods alternating one-by-one with those of said first drive signal and with duration less than a duration of periods of disactivation of the second square wave drive signal and different from that of the activation periods of the first drive signal and depending on the slopes of said upward and downward ramps, so that simultaneous disactivation periods of both drive signals are defined between each pair of alternating activation periods of the first and second square wave drive signals.

2. Generator of drive signals according to claim 1, characterized in that said comparators are of the hysteresis type.

3. Generator of drive signals according to claim 1, characterized in that the generator of drive signals is a monolithic integrated circuit.

4. A generator of drive signals for transistors connected in a half-bridge configuration, characterized in that it comprises a ramp generator suitable for receiving a square wave input signal and converting it into an output signal variable between a lower level and an upper level with upward and downward ramps having a preset slope, a first comparator with a non-inverting input connected to the output of said ramp generator and an inverting input connected to a first source for a first reference signal to generate a first drive signal having activation periods with duration less than a duration of periods of disactivation of said first drive signal and depending on the slopes of said upward and downward ramps, and a second comparator with an inverting input connected to the output of said ramp generator and a non-inverting input connected to a second source for a second reference signal to generate a second drive signal having activation periods alternating one-by-one with those of said first drive signal and with duration less than a duration of periods of disactivation of the second drive signal and depending on the slopes of said upward and downward ramps, characterized in that said ramp generator comprises a comparator with a non-inverting input fed with said input signal and an inverting input connected to an intermediate branch point between a first current generator and a second current generator controlled by a switch driven by the output of said comparator, said intermediate branch point being connected to a capacitor which may be charged at a voltage constituting said output signal of said ramp generator, there being provided means for determining said upper and lower limits of said output voltage.

5. Generator of drive signals according to claim 4, characterized in that said limit establishing means includes a transistor connected between said inverting input of comparator and ground where a preset reference voltage is applied to the base of the transistor.

* * * * *